United States Patent [19]
Osakada et al.

[11] Patent Number: 6,061,238
[45] Date of Patent: May 9, 2000

[54] INFORMATION PROCESSING APPARATUS, METHOD OF ARRANGING COMPONENTS OF THE APPARATUS, AND HEAT SINK

[75] Inventors: Hideyuki Osakada, Fujisawa; Yukihiro Seki; Tsunehiro Tobita, both of Yokohama; Junichi Taguri, Hadano; Hiroshi Mochizuki, Isehara, all of Japan

[73] Assignee: Hitachi, Ltd., Tokyo, Japan

[21] Appl. No.: 09/340,138

[22] Filed: Jun. 28, 1999

[30] Foreign Application Priority Data

Jun. 29, 1998 [JP] Japan ................................. 10-182024

[51] Int. Cl.[7] ........................................................ H05K 7/20
[52] U.S. Cl. ........................... 361/703; 361/724; 361/785; 361/704; 165/122; 340/625; 330/100
[58] Field of Search ............................ 361/683, 690–695, 361/702–710, 717–719, 785, 784, 724; 165/80.3, 80.4, 122; 439/64, 76.1, 61, 83; 454/184, 213.1; 340/625; 324/158.1; 333/100; 257/706–726

[56] References Cited

U.S. PATENT DOCUMENTS 4,511,950  4/1985  Bunner et al. ........................... 361/413
5,218,514  6/1993  Huynh et al. ........................... 361/384
5,961,352  10/1999 Denny et al. ........................... 439/637

OTHER PUBLICATIONS

Goodenough, "Here Comes VRM Controlling IC's Corresponding to the Latest Microprocessors One After Another", *Nikkei Electronics*, Jun. 2, 1997, pp. 113–116.

*Primary Examiner*—Leo P. Picard
*Assistant Examiner*—Michael Datskovsky
*Attorney, Agent, or Firm*—Antonelli, Terry, Stout & Kraus, LLP

[57] ABSTRACT

An information processing apparatus includes a plurality of processor boards arranged parallelly on the main board and the DC—DC converters for generating operation voltages for processor devices each disposed between the adjacent processor boards. Further, a metal plate with high thermal conductivity is placed in close contact with an area of each of the processor boards where devices generating a large amount of heat are mounted. Heat dissipating fins are joined to the surface of each of the metal plates so that when the processor boards are mounted on the main board, the heat dissipating fins do not contact the DC—DC converter. The heat dissipating fins and the DC—DC converters are arranged so that they are vertically disposed one over the other with respect to the main board.

6 Claims, 5 Drawing Sheets

INFORMATION PROCESSING APPARATUS, METHOD OF ARRANGING COMPONENTS OF THE APPARATUS, AND HEAT SINK

CROSS-REFERENCE TO RELATED APPLICATION

This application relates to U.S. patent application Ser. No. 09/271,874 filed Mar. 18, 1999 entitled "ELECTRONIC APPARATUS HAVING COOLING SYSTEM", by Y. SEKI, et al., the disclosure of which is incorporated herein by the reference.

BACKGROUND OF THE INVENTION

1. Field of the Invention

The present invention relates to an information processing apparatus capable of mounting a plurality of processor boards, and more specifically to a method of arranging the processor boards and DC—DC converters and to a structure of their heat sink.

2. Description of the Related Art

In recent years, there are growing demands on processors used in the information processing apparatus for higher performance and an increasing number of processors running at higher frequencies are becoming widely available. The processors running at high-speed clocks in excess of 200 MHz operate at voltages lower than the conventional standard supply voltages of 5V and 3.3V. Because the operating voltage differs depending on the kind of processor and the manufacturing process of LSI, it is common practice to install a DC—DC converter for each processor to generate voltages required by individual processors. One such example is described in "Nikkei Electronics 1997/6-2" No. 690, page 113–116, published by Nikkei BP.

SUMMARY OF THE INVENTION

In a multiprocessor system in which a single information processing apparatus can mount a plurality of processors, a DC—DC converter is required for each processor, which increases the size of a printed circuit board. With a view to reducing influences of noise and securing a stable power supply, it is desired that the DC—DC converter and the processor be arranged as close to each other as possible. The distances between the processor and other processors, memory devices and PCI bridges should also be reduced to realize high speed data transfer on a processor bus.

In a multiprocessor system of recent years, processors and cache memories are mounted on a small printed circuit board called a processor board, which is then vertically mounted on a main printed circuit board through a connector. In the multiprocessor system, the processor boards should be so arranged as to shorten their distance to secure a timing margin for a processor bus signal.

The processor board that produces a large amount of heat requires a heat sink having a relatively large heat dissipating fins. When a plurality of processor boards with heat sinks are mounted parallelly on a main printed circuit board, components having a few centimeters high cannot be installed between adjacent processor boards because they abut against the heat dissipating fins of the heat sinks. Further, signal patterns of processor bus are wired in high density on the main printed circuit board between the processor boards and thus arranging complex circuits there is not desirable. For these reasons, the mounting areas between the adjacent processor boards are not currently utilized efficiently.

Under these limiting conditions of mounting, a component arrangement method is called for which can meet electric requirements while minimizing an increase in the size of the main printed circuit board.

It is an object of the present invention to provide an information processing apparatus which can shorten wiring between adjacent processor boards while securing a mounting area on the main printed circuit board and which can shorten wiring between the processor boards and DC—DC converters, the information processing apparatus in which a plurality of processor boards each with a processor device being mounted on a main printed circuit board.

It is also an object of the invention to provide a method of arranging the processor boards and the DC—DC converters.

Another object of the present invention is to provide an information processing apparatus that can achieve the above-described first object even with the processor boards each mounted with a heat sink; a method of arranging the processor boards and the DC—DC converters; and a heat sink to realize the arrangement method.

The above-described object is realized by arranging two or more processor boards parallelly on the main printed circuit board and by arranging, between the two processor boards, the DC—DC converters that generate operation voltages for the processor devices.

Further, the wiring length of the processor bus is minimized by making an arrangement so that the relation $L=X+Y+Z$ holds where L is an interval between the two processor boards, X is a width of the DC—DC converter modules, Y is a space necessary for inserting and removing the DC—DC converter module, and Z is a space necessary for inserting and removing the processor board.

In another view of the invention, the following provision is made on the heat sink of the processor boards to achieve the above object. That is, a plate member with high thermal conductivity is held in close contact with an area of each of the processor boards where devices generating a large amount of heat are mounted; and heat dissipating fins are joined to a surface of each of the plate members in such a manner that when the processor boards are mounted on the main board, the heat dissipating fins do not contact the DC—DC converters. The heat dissipating fins arranged in this way are used as a heat sink. That is, by using a heat sink so arranged that the heat dissipating fins and the DC—DC converters are vertically disposed one over the other with respect to the main board, the above object can be achieved.

DESCRIPTION OF THE EMBODIMENTS

Now, preferred embodiments of the present invention will be described in detail by referring to the accompanying drawings. It should be noted that these embodiments do not limit the invention in any way.

Figure 1:
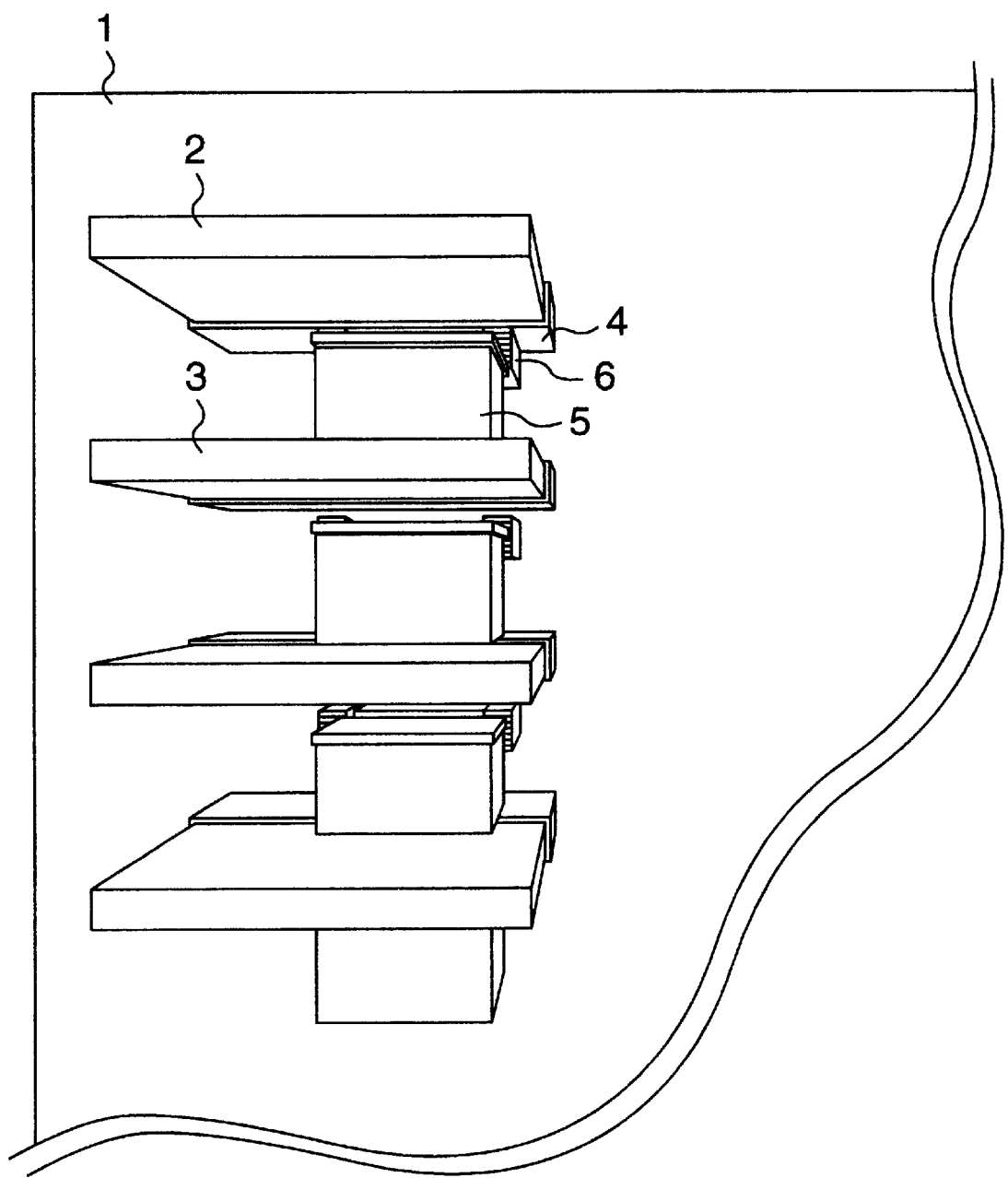
FIG. 1 illustrates a main printed circuit board of a multiprocessor system on which processor boards and DC—DC converter modules are mounted according to the present invention.

FIG. 1 shows a main printed circuit board or main board of a multiprocessor system mounted with processor boards 2 and DC—DC converter modules 5 according to this invention. The main board 1 of the multiprocessor system of this embodiment is mounted with four parallelly arranged processor board sockets 4 in such a manner that two adjacent processor board sockets are on both sides of each DC—DC converter module socket 6. The two processor board sockets 4 are connectors that allow the processor boards 2 and 3 to be mounted vertically onto the main board 1. The DC—DC converter module sockets 6 are connectors for receiving the DC—DC converter modules 5. While in this embodiment the DC—DC converters are shown as the DC—DC converter modules 5 that may be removably fitted into the sockets, they may be mounted directly on the main board 1. With this invention, a space between the adjacent processor boards can be utilized effectively as a mounting area for the DC—DC converter.

Figure 2:
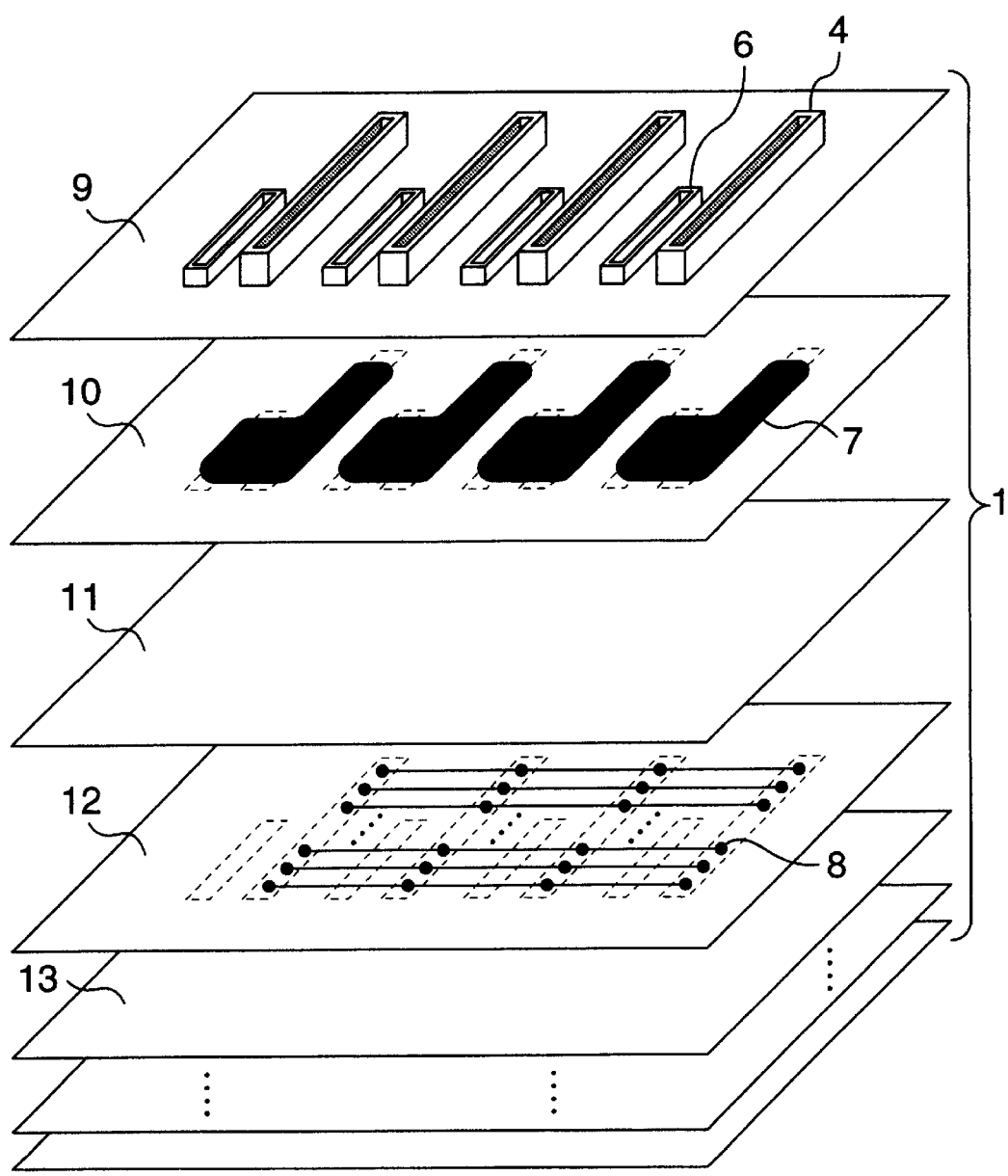
FIG. 2 illustrates, in the arrangement of FIG. 1, an example layout of inner layers of the main printed circuit board on which are laid processor bus signal patterns and DC—DC converter output voltage patterns.

FIG. 2 shows one example layout, in the arrangement of FIG. 1, of inner layers of the main board on which processor bus signal patterns and DC—DC converter output voltage patterns are formed. The main board 1 has a multilayer structure which includes, from top to bottom in the order, an A-layer 9, a B-layer 10, a C-layer 11, a D-layer 12 and an E-layer 13, the A-layer 9 having the processor board sockets 4 and the DC—DC converter module sockets 6 directly mounted thereon. While in this embodiment only five layers are explained for simplicity, the number, positions and order of layers are not limited to those of this embodiment. The DC—DC converter output voltage patterns 7 for supplying operating voltages from the DC—DC converter module sockets 6 to the processor board sockets 4 are wired either as island patterns that cover all the pins to be connected or as wide strip patterns. The processor bus signal patterns 8 are wired in a direction perpendicular to the processor board sockets 4. In this embodiment, the processor bus signal patterns 8 are laid on the D-layer 12. In this case, the C-layer 11 or E-layer 13 adjacent to the D-layer 12 cannot be formed with a pattern that may change the impedance of the processor bus signal patterns 8 or induce crosstalks.

In this embodiment, the entire surface of the C-layer 11 is made a ground pattern. Because the ground pattern C-layer 11 is interposed between the B-layer 10 where the DC—DC converter output voltage patterns 7 are formed and the D-layer 12 where the processor bus signal patterns 8 are formed, these patterns 7 and 8 can be prevented from adversely affecting each other, thus realizing the information processing apparatus of the invention without a problem. This embodiment enables the wiring distance between the processor boards and the DC—DC converter output voltage patterns to be reduced, thus eliminating power losses due to long wires.

Figure 3:
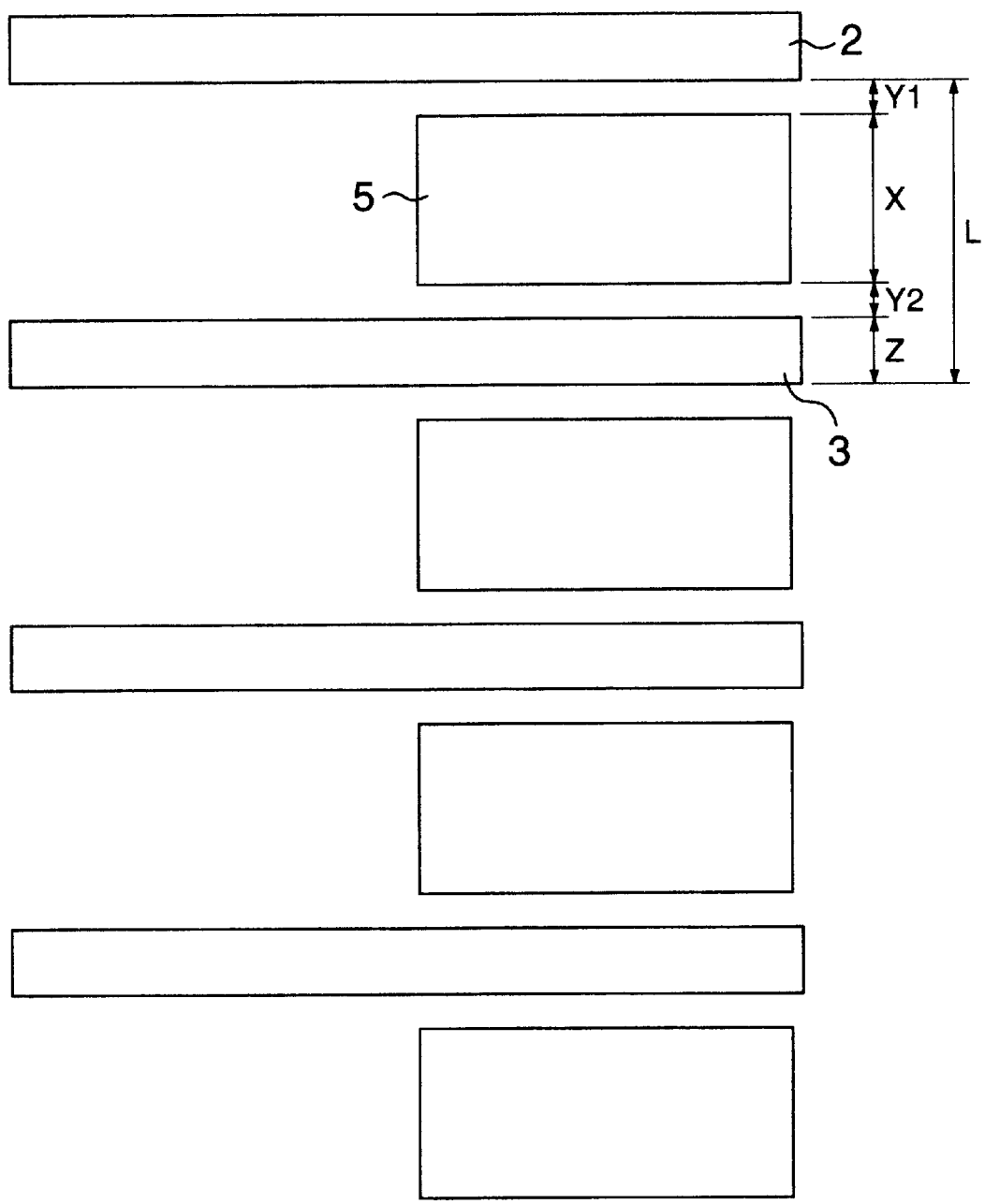
FIG. 3 illustrates distances between the processor boards and the DC—DC converter modules according to the present invention.

FIG. 3 shows distances between the processor boards 2 and 3 and the DC—DC converter module 5 in another embodiment of the invention. To operate the processor bus connecting to the processor boards 2 and 3 at high frequencies, it is desired that the wiring distance of the processor bus signal patterns 8 be made short. According to this invention, the wiring length of the processor bus signal patterns 8 can be minimized by making an arrangement so that the relation $L=X+Y1+Y2+Z$ holds where L is an interval between the processor boards 2 and 3, X is a width of the DC—DC converter module 5, Y1 and Y2 are minimum spaces necessary for inserting and removing the DC—DC converter module and the processor board, and Z is a width of the processor board 2. As for the spaces Y1 and Y2 necessary for inserting and removing the DC—DC converter module 5 and the processor board 2, the following setting may be made. When, for example, insertion and removal is done by using a machine, only a space about several millimeters wide corresponding to the precision of the machine during operation needs to be provided. When insertion and removal is done manually and when the components are removed or inserted in the lengthwise direction, a space should be set which is large enough with some safety margin so that the DC—DC converter module 5 and the processor board 2 do not contact during insertion or removal. When the components are removed or inserted in the widthwise direction, a space similar to the one provided for the above case where the components are inserted or removed in the lengthwise direction should preferably be provided, considering that the insertion and removal is performed by gripping the upper part of the DC—DC converter module 5 or processor board 2. This arrangement offers the advantage of being able to secure a greater timing margin of the processor bus signal.

With this embodiment, when the processor boards require heat dissipating fins, effects similar to those described above can also be produced by implementing the following method in addition to the above-described method.

Figure 4:
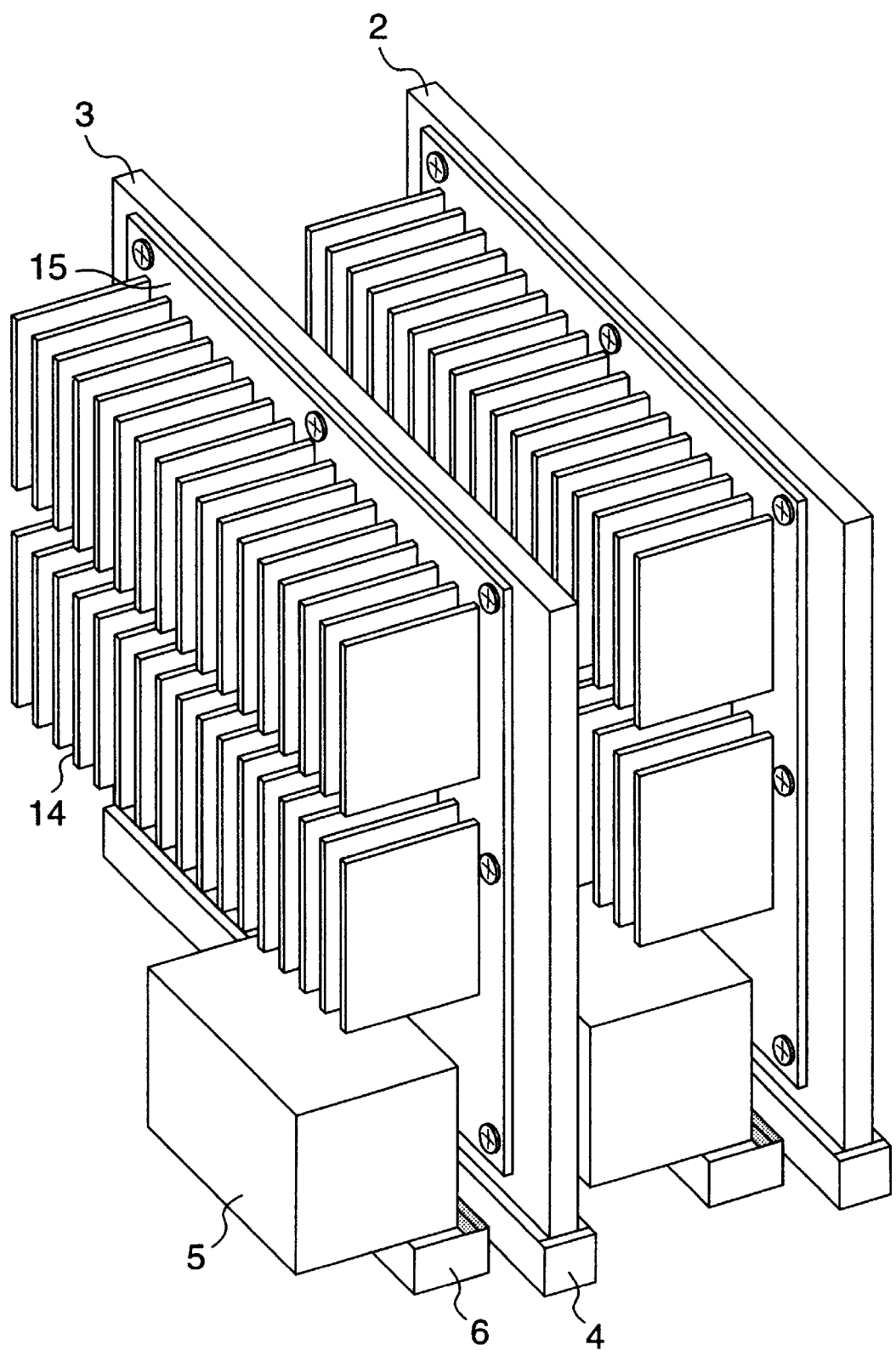
FIG. 4 illustrates an example installation of heat sinks of the present invention in the arrangement of FIG. 1.

FIG. 4 shows one example arrangement in which a heat sink of the invention is mounted. This Fig. shows only two each of the processor boards 2 and the DC—DC converter modules 5 for simplicity.

The processor boards 2 and 3 are mounted with components that produce a large amount of heat, such as processor core chips and performance enhancing cache memories. With this invention, first, a metal plate 15 with high thermal conductivity is held in close contact with the entire surface of the processor boards 2 and 3. The heat dissipating fins 14 are set at such heights that they clear the DC—DC converter modules 5 mounted on the sockets 6, and are then joined to the metal plates 15. The metal plates 15 mounted with the heat dissipating fins 14 are used as heat sinks of the processor boards 2 and 3. This arrangement allows the heat sinks to be mounted to the processor boards 2 and 3 without extending the distance between the processor boards 2 and 3. This arrangement also realizes heat sinks which can dissipate heat that is generated by the DC—DC converter modules 5 and by those areas below the heat dissipating fins 14 because such heat can be transmitted through the metal plates 15 and released from the heat dissipating fins 14.

With this embodiment, even when heat sinks are attached to the processor boards 2 and 3, it is possible to mount the heat sinks without causing interference between the heat sinks and the DC—DC converter modules 5, i.e., without increasing the distance between the processor boards 2 and 3. This embodiment can therefore produce effects similar to those described above.

Figure 5:
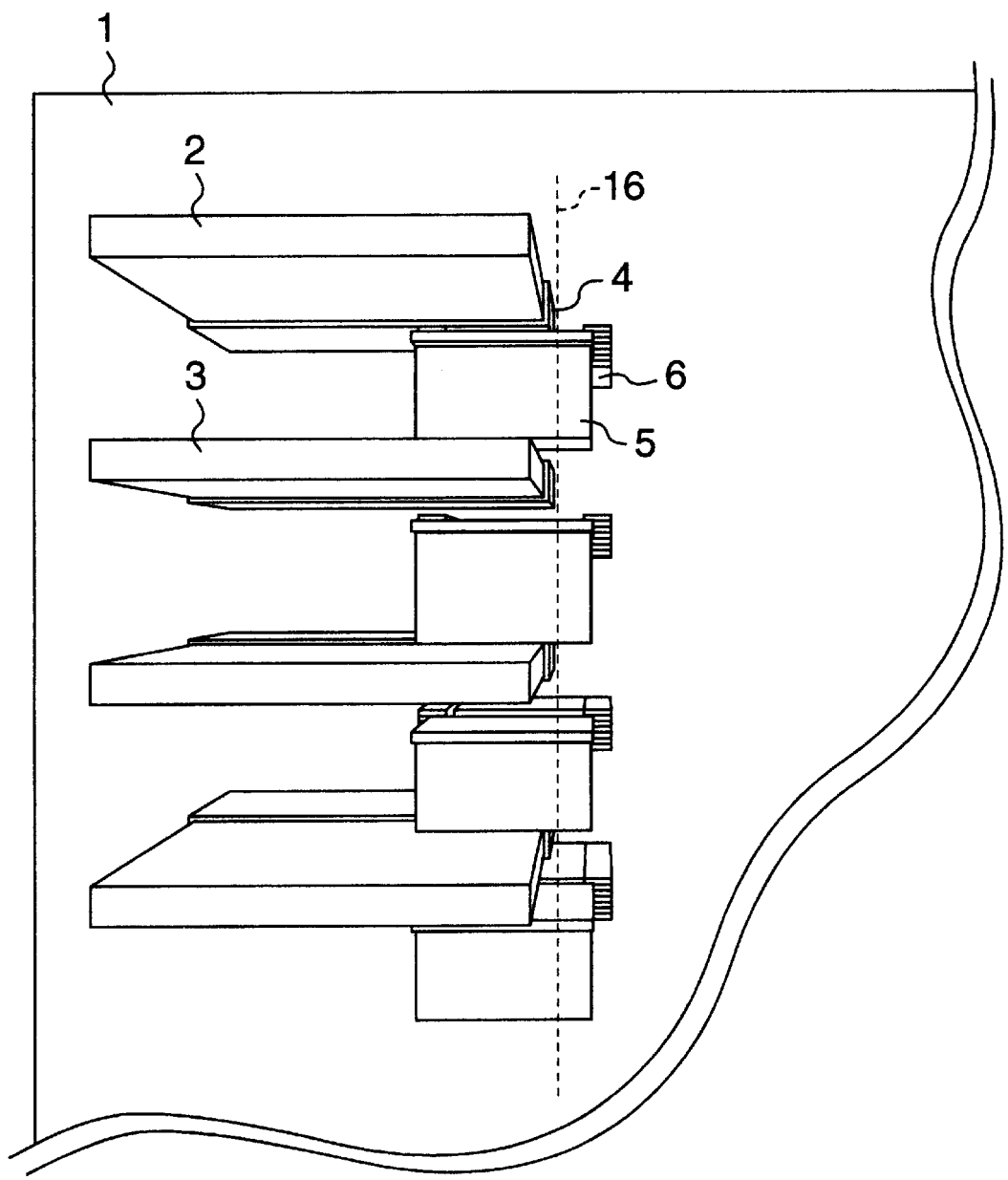
FIG. 5 illustrates another embodiment of the main printed circuit board of a multiprocessor system mounted with processor boards and DC—DC converter modules according to the present invention.

FIG. 5 shows another embodiment of the main board of the multiprocessor system mounting the processor boards and the DC—DC converter modules. Unlike the embodiments shown in FIGS. 1 to 4, this embodiment has the DC—DC converter modules 5 arranged in areas extending outside a line 16 that connects the ends of the processor boards 2 and 3. This arrangement may be employed when there are extra mounting areas on the main board 1 or when components other than the DC—DC converter modules are installed between the adjacent processor boards 2 and 3.

Although the preceding embodiments have shown the cases where two or four processor boards and two or four DC—DC converters are required, the present invention does not limit the number of the processor boards or the DC—DC converters and can be applied to other cases.

We claim:

1. In information processing apparatus including a main board mounting a plurality of processor boards each having a processor device and DC—DC converters for generating operation voltages for the processor devices, the plurality of processor boards being arranged on the main board in parallel and the DC—DC converters being arranged between the adjacent processor boards, the apparatus comprising:

heat dissipating fins joined to a surface of each of plate members having a shape covering over an area where devices generating a large amount of heat are mounted on the processor boards and a position where the processor boards are non-contacted to the DC—DC converters with the processor boards mounted on the main board.

2. In information processing apparatus including a main board mounting a plurality of processor boards each having a processor device and DC—DC converters for generating operation voltages for the processor devices, the plurality of processor boards being arranged on the main board in parallel and the DC—DC converters being arranged between the adjacent processor boards, the apparatus comprising:

heat dissipating fins joined to a surface of each of plate members having a shape covering over an area where devices generating a large amount of heat are mounted on the processor boards, and disposed over the DC—DC converters with respect to the main board with the processor boards mounted on the main board.

3. An information processing apparatus comprising:

a plurality of processor boards each having a processor device;

DC—DC converters for generating operation voltages for the processor devices; and a main board mounted with the processor boards and the DC—DC converters;

wherein the plurality of processor boards are arranged parallelly on the main board and the DC—DC converters are each disposed between the adjacent processor boards.

4. An information processing apparatus according to claim 3, wherein L is set between a value of X+Z and a value obtained by adding margins for inserting and removing each of the DC—DC converters and each of the processor boards to X+Z, where L is an interval between the plurality of processor boards, X is a width of each of the DC—DC converters and Z is a width of each of the processor boards.

5. An information processing apparatus according to claim 3, further including:

a plate member so shaped as to cover an area of each of the processor boards where devices generating a large amount of heat are mounted; and heat dissipating fins joined to a surface of each of the plate members at locations such that when the processor boards are mounted on the main board, the heat dissipating fins do not contact the DC—DC converters.

6. An information processing apparatus according to claim 3, further including:

a plate member so shaped as to cover an area of each of the processor boards where devices generating a large amount of heat are mounted; and heat dissipating fins joined to a surface of each of the plate members so that when the processor boards are mounted on the main board, the heat dissipating fins are disposed over the the DC—DC converters.

* * * * *